(12) United States Patent
Bookhardt et al.

(10) Patent No.: US 6,222,734 B1
(45) Date of Patent: Apr. 24, 2001

(54) CLAMPING HEAT SINKS TO CIRCUIT BOARDS OVER PROCESSORS

(75) Inventors: Gary L. Bookhardt, Aloha; Shawn S. McEuen, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/450,080

(22) Filed: Nov. 29, 1999

(51) Int. Cl.[7] .................................................. H05K 7/20
(52) U.S. Cl. ........................... 361/719; 24/458; 257/719; 257/727; 267/160
(58) Field of Search ............................. 361/703, 704, 361/710, 717–719; 165/80.3, 185; 257/706, 707, 718, 719, 726, 727; 24/453, 457, 458, 459, 473, 625; 267/150, 158, 160; 248/316.7, 505, 510; 174/16.3

(56) References Cited

U.S. PATENT DOCUMENTS

| 5,109,318 | * | 4/1992 | Funari . | |
| 5,130,888 | | 7/1992 | Moore | 361/386 |
| 5,660,562 | * | 8/1997 | Lin . | |
| 5,671,118 | * | 9/1997 | Blomquist . | |
| 5,804,875 | * | 9/1998 | Remsburg . | |
| 5,847,928 | | 12/1998 | Hinshaw et al. | 361/704 |
| 5,860,195 | * | 1/1999 | Wang . | |
| 5,953,212 | * | 9/1999 | Lee . | |
| 6,055,159 | * | 4/2000 | Sun . | |
| 6,130,821 | * | 10/2000 | Gerber . | |

FOREIGN PATENT DOCUMENTS 0 619 605   10/1994   (EP) .

OTHER PUBLICATIONS

"Spring–Clip—Sink", Almquist, IBM tech discl bull., vol. 23 No. 12 May 1981, pp. 5303.*

Aavid Thermal Technologies, Inc., "Passive Heat Sinks for Intel's Pentium Pro Processor", Oct. 1995 (Preliminary Release, Revision A), 3 Pages.

* cited by examiner

Primary Examiner—Gerald Tolin
(74) Attorney, Agent, or Firm—Trop, Pruner & Hu, P.C.

(57) ABSTRACT

A heat sink may be spring strapped onto a socketed processor using clips that engage the spring strap and that are pre-positioned on the circuit board. The clips may be C-shaped and may include an upper spring arm portion, a vertical portion, and a base which may be surface mounted to the circuit board. The upper spring arm of the C-shaped clip then releasably engages the spring strap to clamp the heat sink firmly onto the socketed processor.

5 Claims, 5 Drawing Sheets

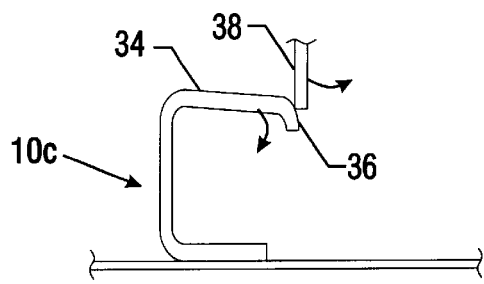 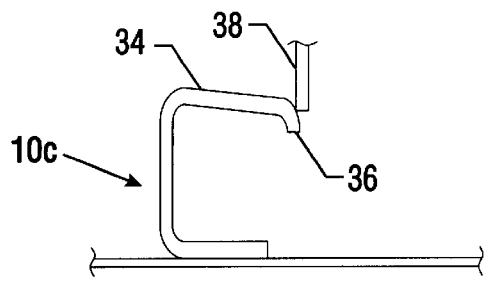
FIG 4a     FIG 4b
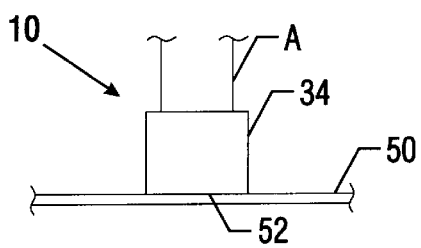
FIG 6
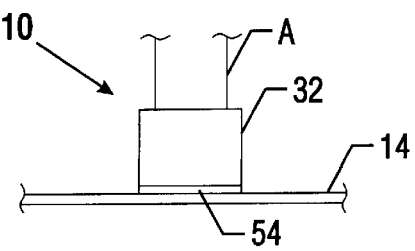
FIG 7

CLAMPING HEAT SINKS TO CIRCUIT BOARDS OVER PROCESSORS

BACKGROUND

This invention relates generally to techniques for securing heat sinks to processors.

Conventionally, a processor is mounted in a socket on a motherboard such as a printed circuit board including a plurality of integrated circuits secured thereto. The integrated circuits may be electrically coupled by conductive lines printed on the circuit board. Heat dissipation affects the operation of the processor and thus it is desirable to have a highly effective and relatively compact heat sink for the processor.

Commonly clips are provided on the socket for the processor. Straps that connect to those clips are used to clamp a heat sink over the processor contained in the socket. This technique provides a firm spring attachment between the heat sink and the processor and is effective in dissipating heat from the processor.

However many available sockets do not include the clips for spring strapping the heat sink onto the socket. While it would be desired to use a spring clip strapping technique, there is no way to attach the strap so as to secure the heat sink over the processor.

Thus there is a need for a way to spring strap heat sinks onto processors secured in sockets without strap attaching clips.

SUMMARY

In accordance with one aspect, a method includes securing at least two clips to a circuit board. A heat sink is clamped over a processor on the circuit board using the clips.

Other aspects are set forth in the accompanying detailed description and claims.

BRIEF DESCRIPTION OF THE DRAWINGS

FIGS. 4a, 4b are partial, enlarged cross-sectional view showing the sequence of attaching a spring loaded strap to a clip in accordance with one embodiment of the present invention;

FIG. 6 is a cross-sectional view taken generally along the line 6—6 in FIG. 5 as the clip is being picked up by a pick and place machine; and FIG. 7 is a cross-sectional view of one embodiment of the present invention showing the placement of a clip on a circuit board.

DETAILED DESCRIPTION

Figure 1:
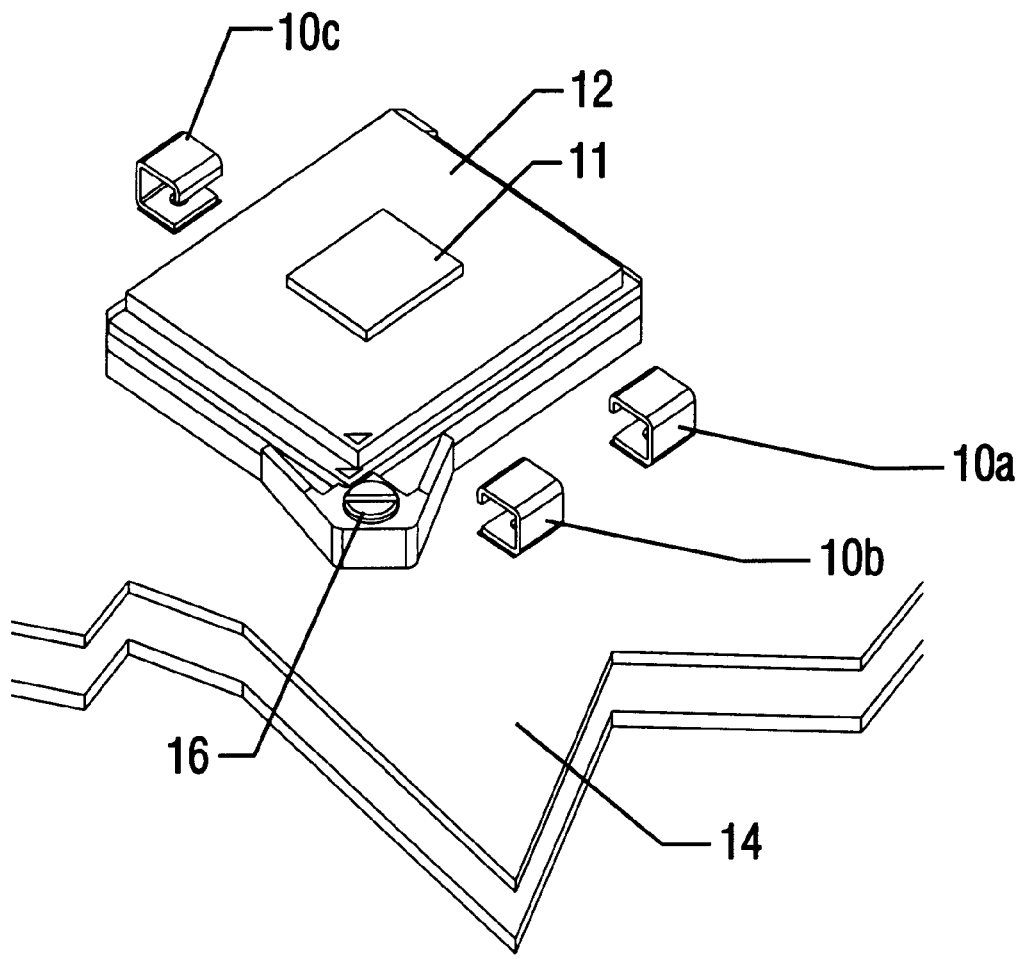
FIG. 1 a perspective view of a socketed processor secured to a circuit board, in accordance with one embodiment of the present invention.

Referring to FIG. 1, a processor 11 is mounted in a socket 12 which is secured to a circuit board 14 such as a printed circuit board. The socket 12 may provide electrical connections between the processor 11 and the circuit board 14. A plurality of C-shaped clips 10 are secured to the circuit board 14 in an opposed relationship adjacent the socket 12. A screw attachment 16 may be utilized to fix the socket 12 on the circuit board 14. In one embodiment of the present invention, the circuit board 14 is a motherboard.

Figure 2:
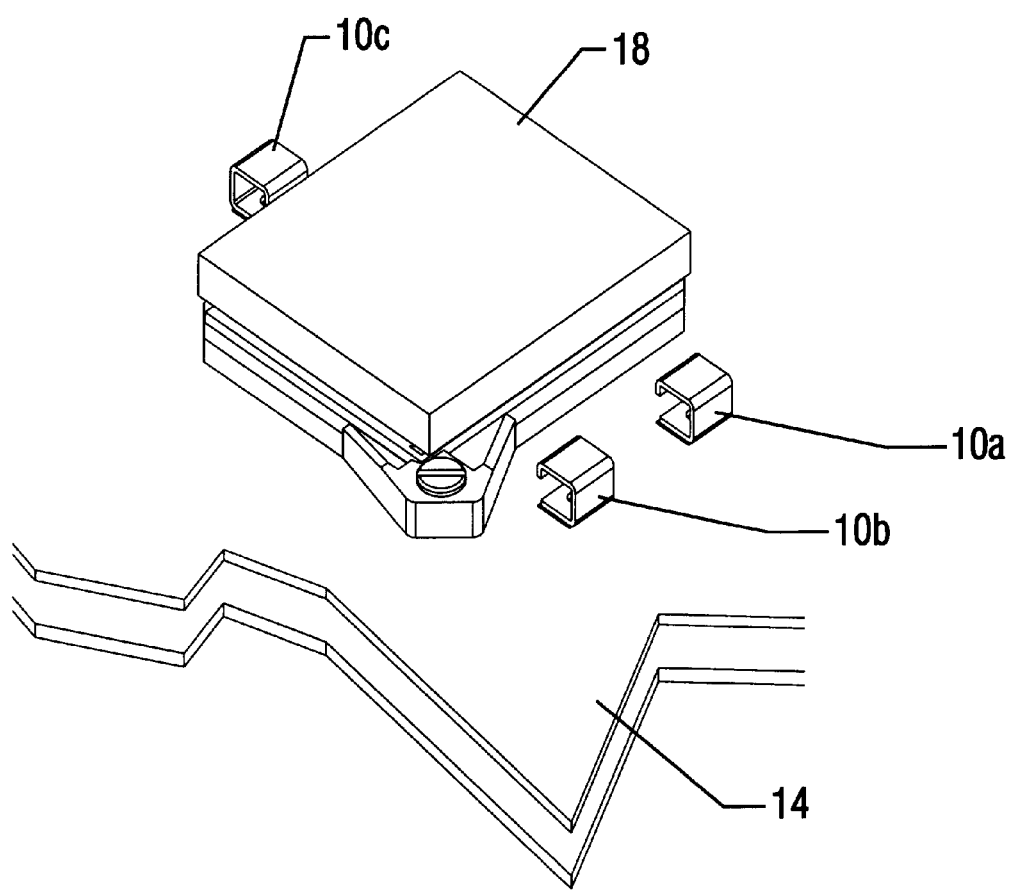
FIG. 2 is a perspective view of a heat sink positioned atop the socketed processor shown in FIG. 1, in accordance with one embodiment of the present invention.

As shown in FIG. 2, a heat sink 18 may be positioned atop the socket 12 over the socketed processor 11. Any of variety of heat sinks may be utilized. The heat sink shown in FIG. 2 is a so-called low profile heat sink. However other heat sinks may be utilized including those which include upstanding heat dissipating fins.

Figure 3:
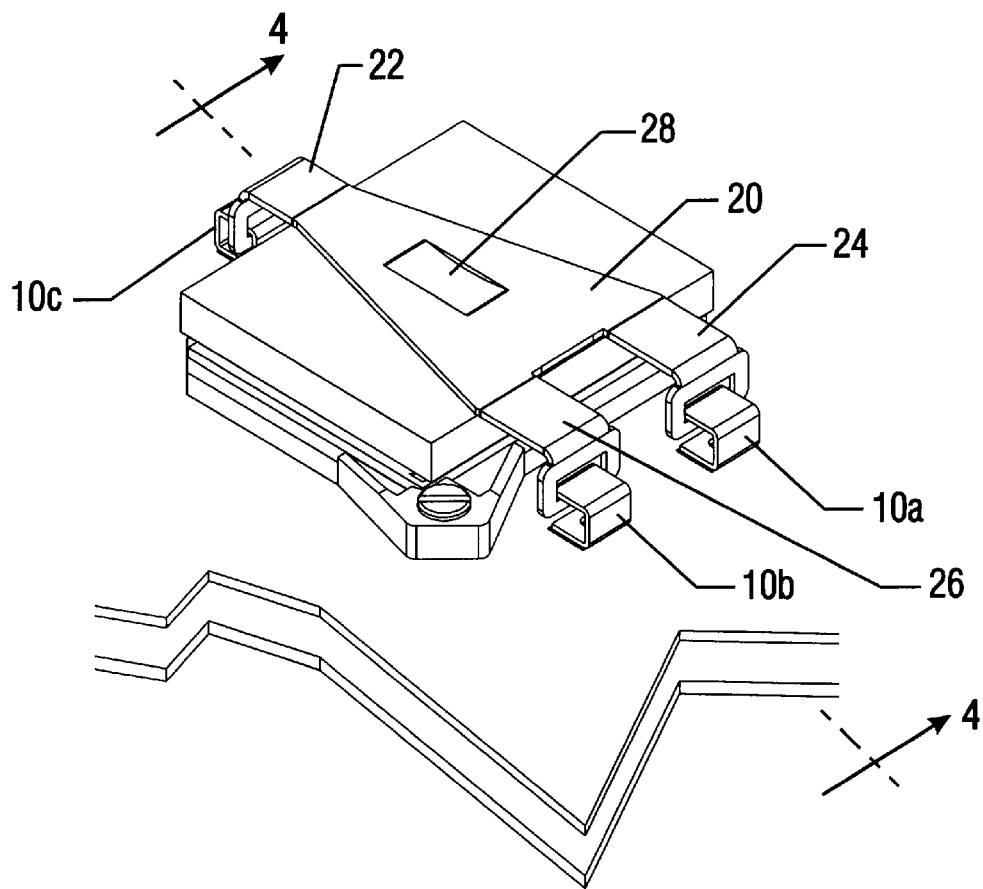
FIG. 3 is a perspective view of a heat sink clamped over a socketed processor, in accordance with one embodiment of the present invention.

The heat sink 18 may be clamped over the socketed processor 11 using a spring loaded clamp 20, as shown in FIG. 3. The clamp 20 may include a bowed, central leaf spring portion 28 and a pair of spring arms 24 and 26 which are opposed to a spring arm 22. The spring arm 22 engages the clip 10c, the spring arm 26 engages the clip 10b, and the spring arm 24 engages the clip 10a. While an embodiment using three spring arms 22, 24, and 26 is illustrated, more or fewer spring arms may be utilized in various embodiments.

The spring loaded strap 20 provides a spring force which securely presses the heat sink 18 into physical contact with the socketed processor 11. In this regard, the strap 20 is advantageously made of a highly resilient material such as spring steel. Likewise, the C-shaped clips 10 may provide a spring action between the point of securement of the clips to the circuit board 14 and the rest of the strap 20. That is, the clips 10 may act as leaf springs which act in concert with the spring action arising from the portion 28. Thus, the clips may also be made of a highly resilient material.

Figure 4:
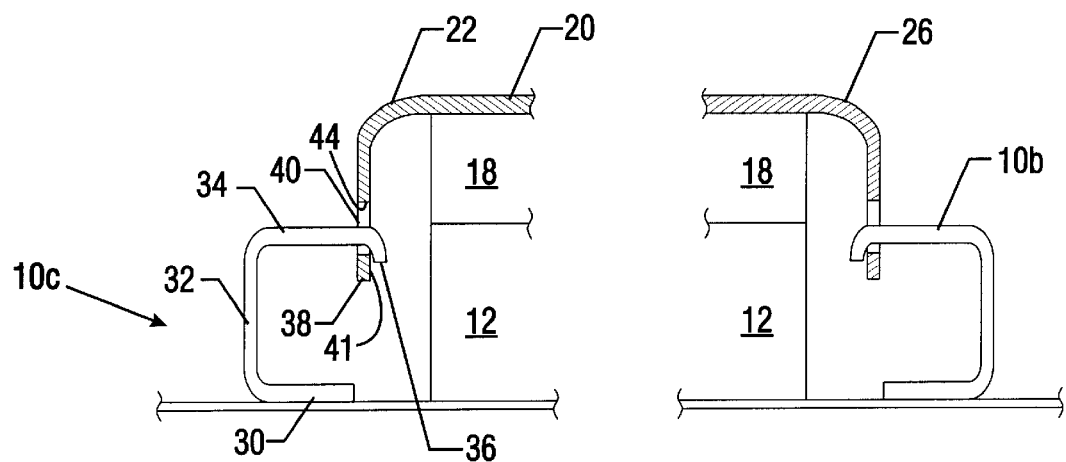
FIG. 4 is a partial, enlarged cross-sectional view taken generally along the line 4—4 in FIG. 3.

As shown in FIG. 4, each clip 10 includes an upper cantilevered leaf spring arm 34, a vertical arm 32, and a base 30. In addition, the spring arm 34 includes a catch 36 which may be turned downwardly relative to the arm 34. The arm 34 and base 30 may be substantially planar and substantially parallel to one another, in one embodiment of the invention.

Similarly, the arms 22, 24, and 26 may include a guide end 38 which is adjacent to an opening 40. The opening 40 is engaged by the catch 36 which is releasably locked to the strap 20 by the guide end 38.

Referring next to FIG. 3, the strap arms 24 and 26 may be hooked onto the clips 10a and 10b so that the catches 36 of the clips 10a, 10b engage the openings 40 in the spring arms 24 and 26. The portion 28 is then rotated atop the heat sink 18. Thereafter, the spring arm 22 is deflected downwardly until its guide end 38 engages the top of the catch 36 as shown in FIG. 4a.

Because of the downwardly deflected configuration of the catch 36 this engagement causes the spring arm 34 to deflect downwardly and the spring arm 22 to deflect inwardly as indicated by the arrows in FIG. 4a. Eventually the arms 34 and 22 slide past one another, as shown in FIG. 4b. Then, the catch 36 springs upwardly along the guide end 38. Eventually the catch 36 springs through the opening 40 and the guide end 38 then springs outwardly trapping the catch 36 in the opening 40, as shown in FIG. 4. The catch 36 is releasably constrained on the side 41 of the guide edge 38. In this way, a spring clamping force may be applied by opposed clips 10 to the strap 20 to securely press the heat sink 18 onto the processor 11.

The securement between the clip 10c and the strap 20 may be released by again depressing the spring arm 22, camming the catch 36 out of the opening 40 through the engagement of edge 44 with the top surface of the catch 36. When the spring arm 22 is released, it moves upwardly quickly, and the catch 36 does not reengage the opening 40.

Figure 5:
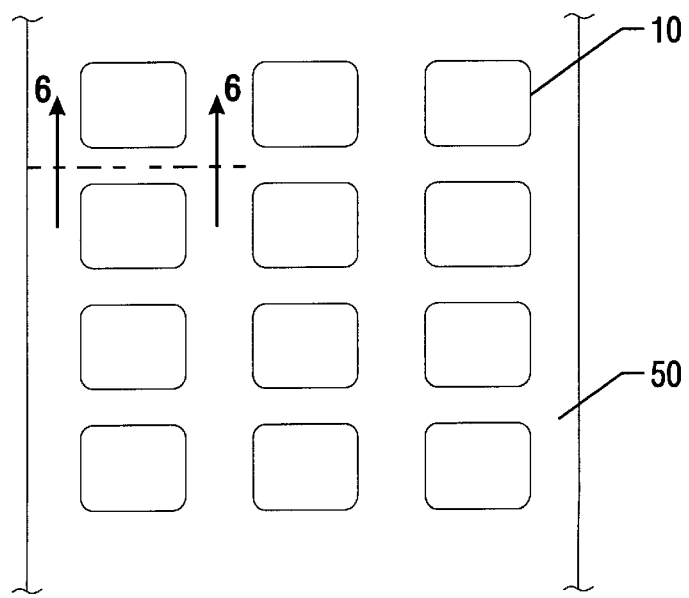
FIG. 5 is a top plan view of a tape containing a plurality of clips in accordance with one embodiment of the present invention.

Turning now to FIG. 5, a tape 50, which may be made of a relatively low cost material wound onto a reel (not shown), includes a plurality of clips 10 secured in rows and columns thereto. The clips 10 may be releasably secured to the tape 50 using a releasable adhesive.

The tape 50 may be unwound into a pick and place machine (not shown) which sequentially engages the clips 10 and places them in the correct positions on the circuit board 14. Thus, as shown in FIG. 6, a pick and place machine vacuum grabber A may engage the upper spring arm 34, lift the clip 10 off of the tape 50 and place the clip 10 at the appropriate position on the circuit board 14. Because of the horizontal, substantially planar configuration of the spring arm 34, the vacuum grabber A has a good surface to engage and lift the clip 10.

The pick and place machine vacuum grabber A may then place the clip 10 on the circuit board 14 in positions precisely preprogrammed into the pick and place machine. The base 30 of each clip 10 is then positioned atop a solder pad 54 defined on the circuit board 14, as shown in FIG. 7. The solder pad 54 may be defined using conventional solder masking techniques.

Thereafter, the circuit board 14 may be processed in a surface mount oven. All of the surface mount components on the circuit board 14 are then heat secured using surface mount technology to the circuit board 14. This means that the clips 10 are soldered to the circuit board 14. Alternatively, a heat activatable adhesive may be used in place of a solder material.

In this way, strapping clips 10 may be positioned on circuit boards in an automated, low cost fashion. The clips enable heat sinks to be quickly strapped onto the socketed processors in cases where clips are not provided with the sockets.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electronic device comprising:

a circuit board having two sides;

a processor socket secured to said circuit board;

a processor mounted in said socket;

a heat sink positioned over said socket and said processor;

at least two clips fixed to said circuit board on two opposed sides of said heat sink; and a spring clamp extending from a clip on one side of said heat sink to a clip on the other side of said heat sink so as to resiliently clamp said heat sink onto said processor, said spring clamp being positioned on the same side of said board as said processor.

2. The device of claim 1 wherein said clips are C-shaped.

3. The device of claim 1 wherein said clips are secured to said circuit board using surface mount techniques.

4. The device of claim 3 wherein each clip is C-shaped including a base which is secured to said circuit board by surface mount techniques and a cantilevered leaf spring arm, which engages said spring clamp, said arm coupled to said base.

5. The device of claim 4 wherein said spring clamp includes an opening and said cantilevered leaf spring arm including a downwardly directed catch, said catch releasably engagable by said opening.

* * * * *